(12) United States Patent
Fernandez

(10) Patent No.: US 8,599,540 B2
(45) Date of Patent: Dec. 3, 2013

(54) MODULAR SYSTEM AND FRAMEWORK FOR SUPPORTING AN ENCLOSURE

(75) Inventor: Pedro A. Fernandez, Dallas, TX (US)

(73) Assignee: Futurewei Technologies, Inc., Plano, TX (US)

( * ) Notice: Subject to any disclaimer, the term of this patent is extended or adjusted under 35 U.S.C. 154(b) by 233 days.

(21) Appl. No.: 13/245,131

(22) Filed: Sep. 26, 2011

(65) Prior Publication Data

US 2013/0075056 A1    Mar. 28, 2013

(51) Int. Cl.
*H05K 7/20*    (2006.01)
*H05K 5/02*    (2006.01)

(52) U.S. Cl.
USPC ...... 361/679.01; 361/600; 361/690; 361/692; 361/730; 312/223.1; 312/223.2; 312/236; 312/406; 312/265.1; 312/265.3; 174/50; 174/58; 174/17 R; 174/547; 174/559; 174/560

(58) Field of Classification Search
USPC ............ 361/600, 601, 670.01, 690–695, 688, 361/689, 698, 699, 700–728, 730–736, 361/831; 165/80.3, 121–126, 104.33, 185; 174/50, 58, 535, 537, 547, 559, 560, 174/17 R; 312/223.1, 223.2, 228.1, 265.1, 312/265.3, 265.6, 236, 406; 454/184
See application file for complete search history.

(56) References Cited

U.S. PATENT DOCUMENTS

| | | | |
|---|---|---|---|
| 6,201,694 B1 * | 3/2001 | Turunen | 361/695 |
| 6,400,567 B1 * | 6/2002 | McKeen et al. | 361/695 |
| 6,788,535 B2 * | 9/2004 | Dodgen et al. | 361/695 |
| 6,877,551 B2 * | 4/2005 | Stoller | 165/47 |
| 6,945,616 B2 * | 9/2005 | Webster et al. | 312/265.3 |
| 7,222,660 B2 | 5/2007 | Giacoma et al. | |
| 7,245,485 B1 | 7/2007 | Morrell | |
| 7,659,476 B2 * | 2/2010 | Hruby et al. | 174/50 |
| 7,683,270 B2 * | 3/2010 | Fernandez et al. | 174/547 |
| 8,403,431 B2 * | 3/2013 | Elkins et al. | 312/265.1 |
| 2005/0129379 A1 * | 6/2005 | Reagan et al. | 385/135 |
| 2006/0273081 A1 * | 12/2006 | Fernandez et al. | 220/3.2 |

* cited by examiner

*Primary Examiner* — Michail V Datskovskiy
(74) *Attorney, Agent, or Firm* — Conley Rose, P.C.; Grant Rodolph; John H. Scott, III

(57) ABSTRACT

A structure for storing and cooling electronics comprising a frame support, an internal equipment chamber mounted to the frame support, wherein the internal equipment chamber comprises a tubelike structure defining openings in a front and a back of the internal equipment chamber, and wherein the internal equipment chamber is configured to support electronic equipment such that the weight of the electronic equipment is born by the frame support and not the internal equipment chamber, and a plurality of removable panels disposed around the frame such that a gap is formed between the exterior of the internal equipment chamber and the plurality of removable panels, wherein air may circulate in the gap between the internal equipment chamber and the plurality of removable panels to help regulate a temperature within the internal equipment chamber.

20 Claims, 8 Drawing Sheets

MODULAR SYSTEM AND FRAMEWORK FOR SUPPORTING AN ENCLOSURE

CROSS-REFERENCE TO RELATED APPLICATIONS

Not applicable.

STATEMENT REGARDING FEDERALLY SPONSORED RESEARCH OR DEVELOPMENT

Not applicable.

REFERENCE TO A MICROFICHE APPENDIX

Not applicable.

BACKGROUND

Various industries commonly utilize indoor and/or outdoor cabinets for storing components. For instance, businesses in the telecommunications industry often use storage cabinets for storing components such as cable, electronic equipment, and the like. In addition to providing an enclosure for storing equipment, cabinets should generally be capable of protecting the stored equipment from elements outside the cabinet. For instance, cabinets are often exposed to relatively harsh elements associated with outdoor environments (e.g., humidity, wind-swept rain and snow, and the like). In order to protect cabinets from such elements, outdoor cabinets may need to be adequately sealed and configured with sufficient structural strength. To this end, various high-strength materials may be employed for enhancing the strength of cabinets. Nonetheless, it may be desirable to limit the quantity of such materials to a reasonable extent, such that overall cost and/or weight are minimized, while overall size is maximized.

SUMMARY

In one embodiment, the disclosure includes a structure for structure for storing and cooling electronics. The structure comprises a frame support, an internal equipment chamber mounted to the frame support, wherein the internal equipment chamber comprises a tubelike structure defining openings in a front and a back of the internal equipment chamber, and wherein the internal equipment chamber is configured to support electronic equipment such that the weight of the electronic equipment is born by the frame support and not the internal equipment chamber, and a plurality of removable panels disposed around the frame such that a gap is formed between the exterior of the internal equipment chamber and the plurality of removable panels, wherein air may circulate in the gap between the internal equipment chamber and the plurality of removable panels to help regulate a temperature within the internal equipment chamber.

In another embodiment, the disclosure includes a system for cooling and protecting electronic equipment, comprising a structural support frame, at least two tubelike internal equipment chambers mounted to the structural support frame, wherein the each of the tubelike internal equipment chambers comprises a plurality of equipment mounting areas configured such that electronic equipment support devices may be affixed to the structural support frame such that the weight of the electronic equipment is born by the structural support frame and not the at least two tubelike internal equipment chambers, a plurality of external panels mounted to the structural support frame such that at least one gap is formed between the plurality of external panels and the at least two tubelike internal equipment chambers thereby allowing air to flow in the gap, wherein the plurality of external panels are configured to protect the tubelike equipment chamber from damage, two double paneled back panels mounted to the structural support and configured such that each of the two double paneled back panels forms a back seal with a respective one of the two tubelike internal equipment chambers; and at least one double paneled door mounted to the structural support and configured to form a seal with at least one of the tubelike internal equipment chambers when the door is closed.

In yet another embodiment, the disclosure includes a thermal system for cooling electronic equipment, comprising a frame including at least a first side having a first opening, a second side having a second opening, and a top side having a third opening, the third opening being substantially perpendicular to the first and second openings, a cabinet disposed within the frame, the cabinet including a first wall attached to the first side of the frame, a second wall attached to the second side of the frame, a third wall attached to the top side of the frame, and a fourth wall that is substantially parallel to the third wall, wherein the first, second, third, and fourth walls define an internal chamber of the cabinet, an inner back panel attached to a back side of the frame, the inner back panel defining a back wall of the cabinet, an inner front panel attached to a front side of the frame, the inner front panel defining a movable front door for selectively permitting access into the internal chamber, wherein the internal chamber is substantially sealed when the front door is in a closed position, a plurality of removable panels disposed around the frame, the plurality of removable panels including at least: a first outer side panel attached to the first side of the frame and disposed opposite the first wall of the cabinet, wherein the first opening of the frame defines a first gap formed between the first outer side panel and the first wall of the cabinet, a second outer side panel attached to the second side of the frame and disposed opposite the second wall of the cabinet, wherein the second opening defines a second gap formed between the second outer side panel and the second wall of the cabinet.

These and other features will be more clearly understood from the following detailed description taken in conjunction with the accompanying drawings and claims.

BRIEF DESCRIPTION OF THE DRAWINGS

For a more complete understanding of this disclosure, reference is now made to the following brief description, taken in connection with the accompanying drawings and detailed description, wherein like reference numerals represent like parts.

FIGS. 2B and 2C are front planar views of the cabinet assembly.

DETAILED DESCRIPTION

It should be understood at the outset that although an illustrative implementation of one or more embodiments are provided below, the disclosed systems and/or methods may be implemented using any number of techniques, whether currently known or in existence. The disclosure should in no way be limited to the illustrative implementations, drawings, and techniques illustrated below, including the exemplary designs and implementations illustrated and described herein, but may be modified within the scope of the appended claims along with their full scope of equivalents.

Disclosed herein is a modular system and framework for supporting a cabinet and parts thereof for storing, cooling, and protecting electronic equipment. In an embodiment the modular system comprises a frame support, an internal equipment chamber mounted to the frame support, and a plurality of removable panels mounted to the frame support. The internal equipment chamber comprises a tubelike structure defining openings in a front and a back of the internal equipment chamber. The internal equipment chamber is configured to support electronic equipment, such that the weight of the electronics equipment is born by the frame and not the internal equipment chamber. The plurality of removable panels are disposed around the frame such that a gap is formed between the exterior of the internal equipment chamber and the plurality of removable panels, thereby allowing air may circulate in the gap between the internal equipment chamber and the plurality of removable panels to help regulate a temperature within the internal equipment chamber. The system is configured such that additional structures may be erected next to each other that share a gap for air flow between the external panels and the one or more equipment chambers.

Figure 1A:
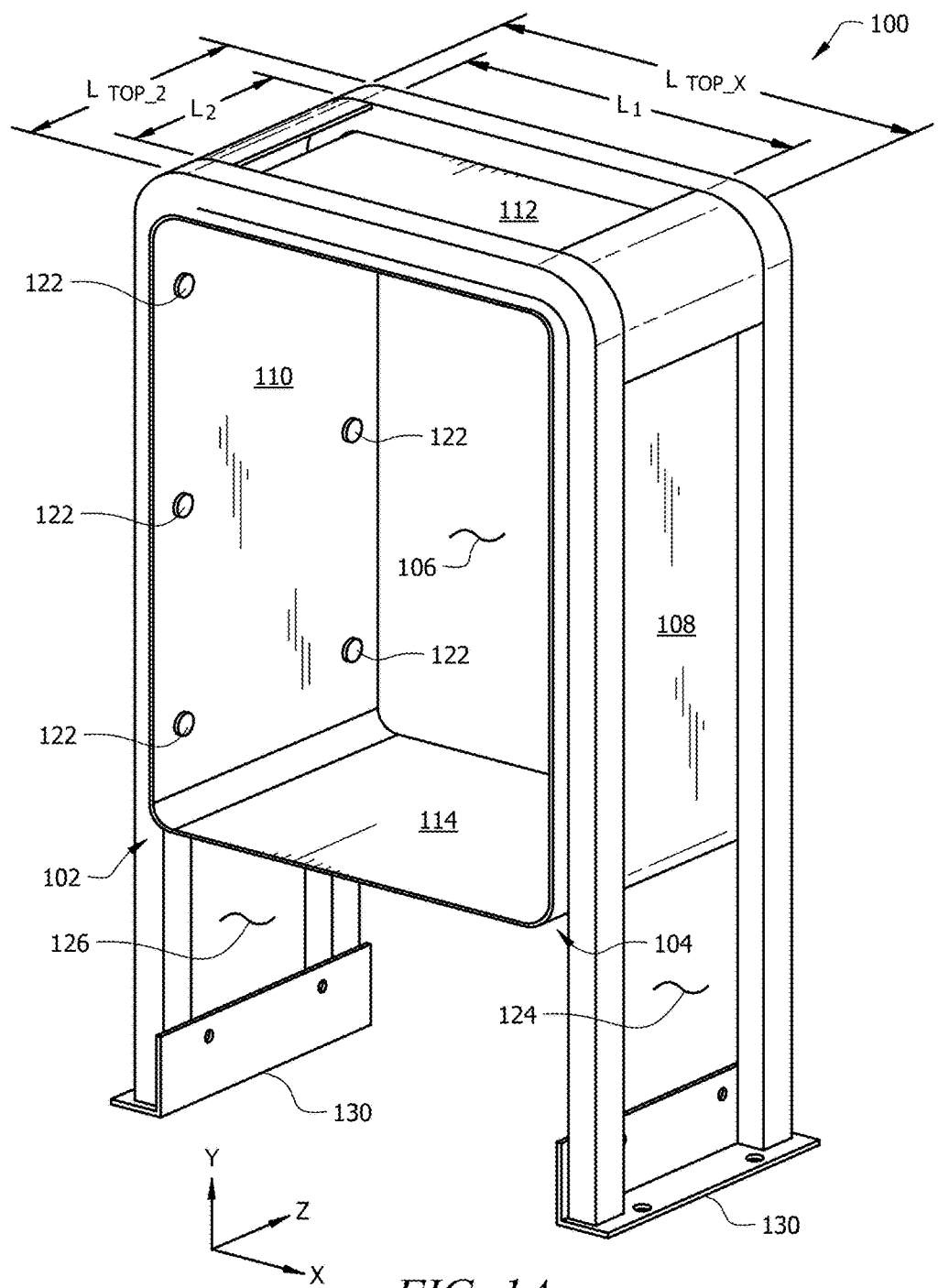
FIG. 1A is an isometric view of a framework for supporting a cabinet according to an embodiment of the present disclosure.
Figure 1B:
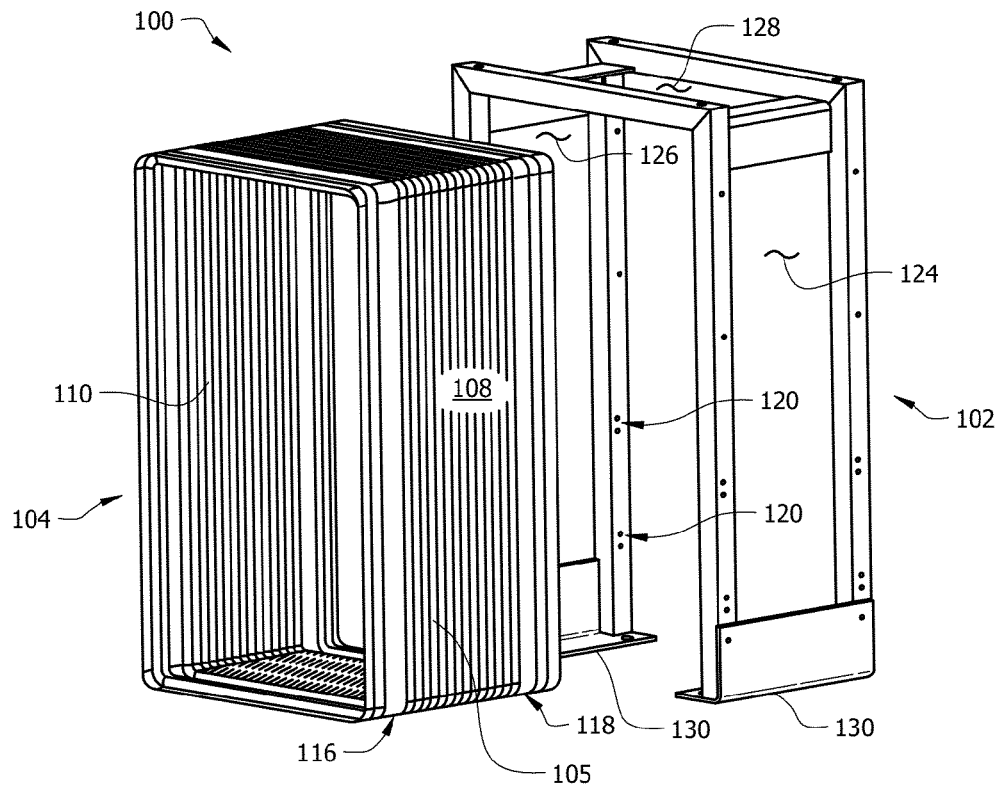
FIG. 1B is an exploded view of the framework according to an alternative embodiment of the present disclosure.
Figure 1C:
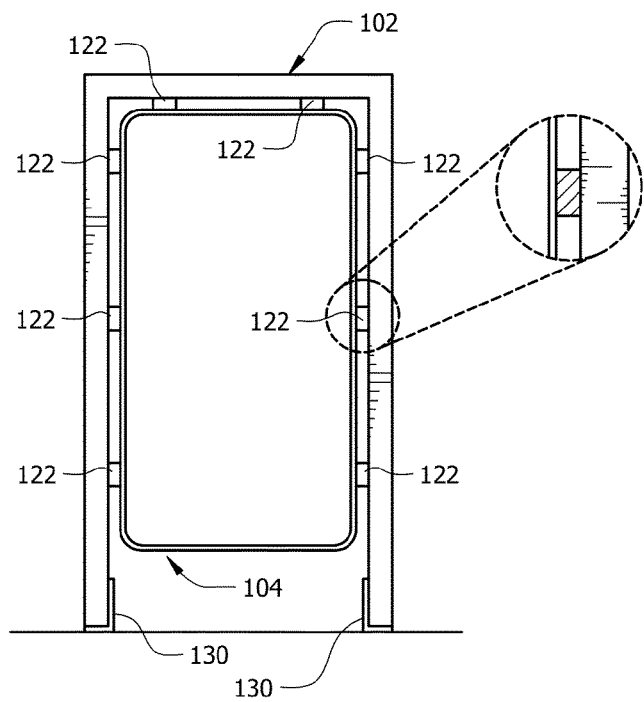
FIG. 1C is a front planar view of the framework according to the embodiments of FIGS. 1A and 1B.

Referring to FIGS. 1A-1C, an embodiment of a framework 100 for supporting a cabinet (or internal equipment chamber) will now be described. As used herein, the term "cabinet" is intended in its broadest sense, and may refer to any suitable structure operable to maintain or store a plurality of components in an infrastructure. The framework 100 comprises a skeletal frame 102 configured to provide all or substantially all of the structural strength necessary to support a cabinet, which will be described in further detail below. While the frame 102 is shown as comprising a U-shaped or three-sided structure, it is to be understood that the frame 102 may comprise any suitable shape and/or configuration for accommodating a cabinet. The frame 102 is attached to a peripheral cabinet wall 104 that defines an internal chamber 106. As discussed further below with respect to FIGS. 3A and 3B, the internal chamber 106 may provide a hollow interior for storing components within a compartment of a cabinet.

For the sake of clarity, the cabinet wall 104 will herein be described as forming a boxlike, tubelike, or rectangular-shaped compartment for a cabinet. However, it is to be understood that in other implementations the shape and overall configuration of the cabinet wall 104 may vary without departing from the scope of the present disclosure. Briefly, for example, the cabinet wall 104 may be configured to form a structure having a shape such that its cross-section is oval, circular, rectangular, triangular, cylindrical, etc. Additionally or alternatively, the cabinet wall 104 may bend or curve at one or more different and/or equal angles to form either a symmetrical or asymmetrical structure having one or more sides of different and/or similar shapes.

Generally, the cabinet wall 104 may comprise a pair of first and second sidewalls 108 and 110 that extend between a top wall 112 and a bottom wall 114. As those of ordinary skill in the art will understand, the cabinet wall 104 may be constructed from a relatively thin sheet or composite of metal configured to maximize heat transfer. In some embodiments, the cabinet wall 104 may include a substantially flat surface, as shown in FIG. 1A, for example. In other embodiments, the cabinet wall 104 may include a corrugated surface, as shown in FIG. 1B, for example. A corrugated surface might be employed to increase surface area and/or to facilitate heat transfer. In embodiments based on a cabinet wall 104 including a corrugated surface, one or more sections of the cabinet wall 104 may be flat or otherwise non-corrugated to provide a convenient surface for attachment to the frame 102.

As shown in FIG. 1B, for example, a pair of flat grooves 116 and 118 may be formed at or about an outer edge of the cabinet wall 104. In addition, the frame 102 may include one or more slots 120 or threaded bores configured to align with the grooves 116 and 118 in order to receive fasteners 122 for attaching the cabinet wall 104 to the frame 102. As indicated in FIG. 1C, such fasteners 122 may include a plurality of elastomer mounts. However, it to be understood that any suitable fasteners may additionally or alternatively be employed, such as, but not limited to, one or more bolts, nuts, pins, rods, screws, welds, rivets, and the like.

In an embodiment, the frame 102 may include a pair of first and second openings 124 and 126 formed on opposing sides of the frame 102. The frame 102 may further include a top opening 128 that is perpendicular or transverse to the side openings 124 and 126. In some aspects, one or more of the openings 124, 126, and/or 128 may define an open area that forms a substantial portion of the surface area of on the corresponding side of the frame 102.

In FIG. 1A, for example, the top opening 128 can be seen as having a first length $L_1$ that extends along a first axis (e.g., x-axis) and that is at least equal to or greater than half of the top length $L_{TOP\_x}$ of the frame 102 that also extends along the first axis. Similarly, the top opening 128 has at least a second length $L_2$ extending along a second axis (e.g., z-axis) that is perpendicular or transverse to the first axis, wherein the second length $L_2$ is at least equal to or greater than half of the top length $L_{TOP\_z}$ of the frame 102 that also extends along the second axis.

In some embodiments, the size and/or shape of one or more of the openings 124, 126, and/or 128 might depend on the size and/or shape of a corresponding cabinet sidewall, 108, 110, and/or 112, respectively. As shown in FIG. 1A, for example, an opening such as the top opening 128 may substantially overlap an external surface of the top cabinet wall 112. Additionally or alternatively, an opening such as a side opening 124 and/or 126 may comprise a region that extends beyond the external surface of the sidewalls 108 and/or 110, respectively. As discussed further below, this extended region may increase the overall space that might be available for an auxiliary chamber formed below the internal chamber 106. Furthermore, the frame 102 may be fixedly disposed on a pair of angles 130 or mounting brackets, e.g., as opposed to a base that may comprise a large surface area extending between each angle 130.

Figure 2A:
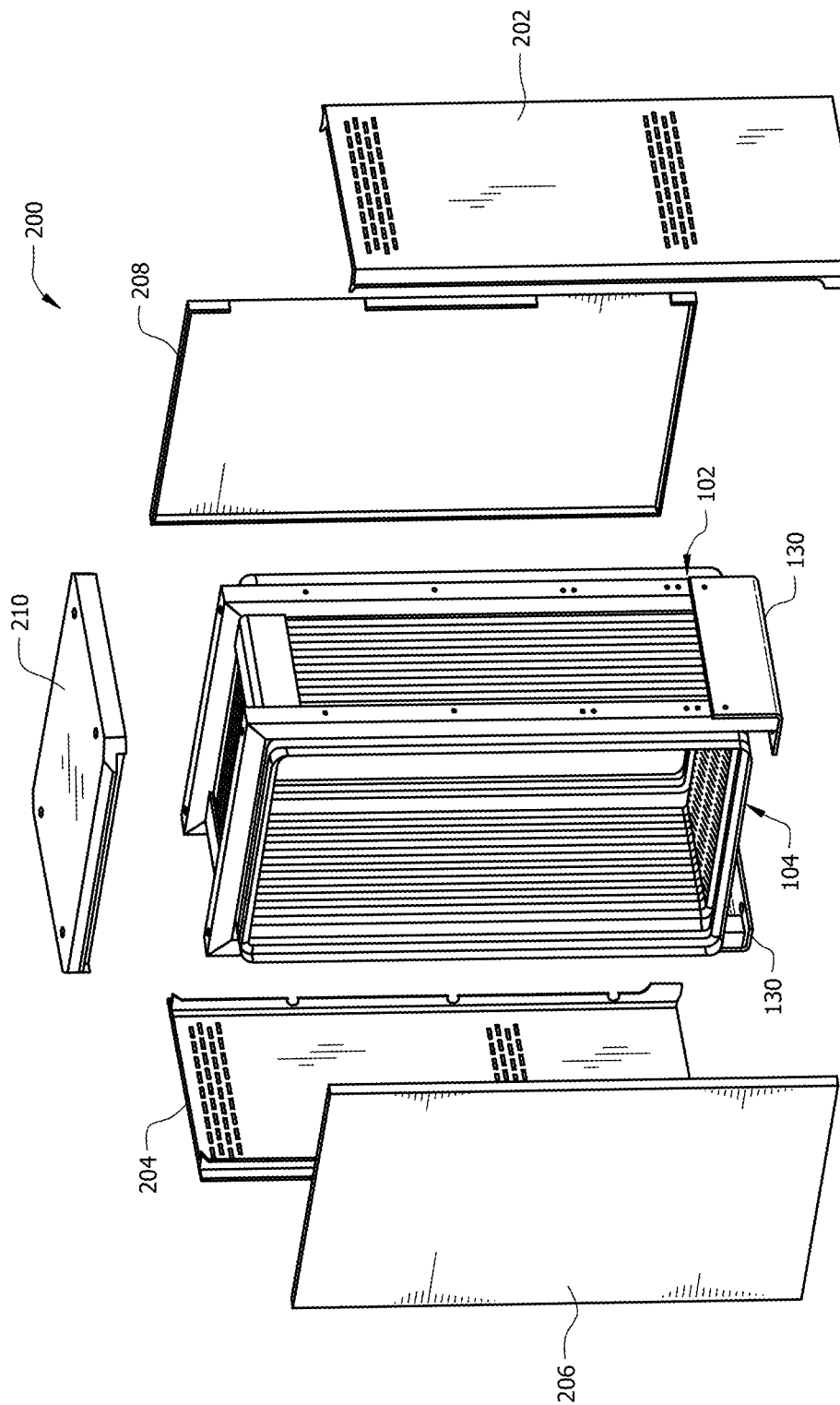
FIG. 2A is an exploded view of a cabinet assembly according to an embodiment of the present disclosure.

As shown in FIG. 2A, an assembly 200 for a cabinet may comprise a plurality of outer panels arranged on or about the exterior of the frame 102. For example, the cabinet assembly 200 may comprise a pair of first and second side panels 202 and 204, a front panel 206, a back panel 208, and/or a top panel 210. The outer panels 202-210 may independently attach to the frame 102 so as to form an outer skin, which might be configured to isolate and protect components stored within the internal chamber 106 of a cabinet.

Moreover, to provide additional protection and/or thermal insulation, the front panel 206 and/or the back panel 208 may comprise or be implemented with one or more other panels so that the outer panels 202-210 and the internal cabinet wall 104 collectively provide a double-wall construction for a cabinet. In one aspect, for example, the front panel 206 may be configured as single-walled front door of a cabinet. In another aspect, the front panel 206 may be arranged exteriorly on or about an inner front panel to provide a double-walled door for a cabinet. Similarly, the back panel 308 may be configured as a single-walled cover defining a back wall of the internal chamber 106. Alternatively, the back panel 308 may be an arranged exteriorly on or about an inner back panel to provide a double-walled back cover for a cabinet.

In an embodiment, one or more of the panels 202, 204, 206, 208, and/or 210 may comprise or be configured as solar shields operable to limit heat absorption and/or help prevent significant increases in temperature within the internal chamber 106. Additionally or alternatively, one or more of the panels 202, 204, 206, 208, and/or 210 may be removable for facilitating access into the internal chamber 106. As shown in FIG. 2B, for example, the frame 102 may include one or more mounting elements 212 (e.g., pins) for selectively attaching the outer side panels 202 and 204 via one or more corresponding slots 214 formed along an inner surface of each panel 202 and 204. Of course, it is to be understood that any suitable technique may additionally or alternatively be employed for attaching any one of the panels 202, 204, 206, 208, and/or 210 to the frame 102. In some aspects, one or more of the panels 202, 204, 206, 208, and/or 210 may be firmly affixed to the frame 102 rather than being more readily removable.

As indicated in FIG. 2B, one or more outer panels (e.g., panels 202, 204, and 210) may attach to the frame 202 such that a gap is formed between each panel and a corresponding wall (e.g., walls 108, 110, and 112). In FIGS. 1A and 2A, for example, it can be seen that when the side panels 202 and 204 attach to the frame 202, the side openings 124 and 126 define a gap extending between the outer surfaces of the sidewalls 108 and 110 and the inner surfaces of the side panels 202 and 204, respectively. Thus, if an external force (e.g., either inadvertently or due to intentional vandalism) were to be applied to an outer side panel 202 or 204, the gap would allow the panel 202 or 204 to deflect inward for about the width of the gap before contacting the corresponding cabinet wall 108 or 110.

In an implementation for an outdoor cabinet, such a gap may reduce the possibility and/or severity of any damage that might otherwise result to components stored within the internal chamber 106. For example, if a driver inadvertently backs a vehicle into an outer panel 202 or 204, the gap may prevent or mitigate any resulting damage to the components since the driver may stop the vehicle before causing the corresponding panel 202 or 204 to contact the internal wall 104 of the cabinet. In some aspects, similar gaps may be provided with respect to the front and back panels 206 and 208. For instance, the front and back panels 206 and 208 may be configured as double-walled panels having a gap formed therebetween. Similarly, a gap may be formed between the top wall 112 and the top panel 210 to provide further protection above and around the walls of the internal chamber 106.

As previously mentioned, the outer panels 202, 204, 206, 208, and 210 may attach to the frame 102 independently with respect to the inner cabinet wall 104. In addition, a pair of independent inner panels may attach to the front and back of the frame 102 so as to form a front and back wall of an internal cabinet. Thus, in the event that an outer panel 202, 204, 206, 208, or 210 suffers any damage, the damaged panel may be fixed or replaced without interrupting any equipment stored within the internal chamber 106. For instance, if a panel such as side panel 202 needs to be replaced, the side panel 202 may be removed without breaking the seal of the internal chamber 106 of the cabinet 200. In other words, one or more outer panels 202, 204, 206, 208, or 210 may be removed without compromising the integrity of any stored equipment, and therefore, any such equipment may remain in normal operation if removal of a panel is necessary.

In some implementations, the outer panels 202, 204, 206, 208, or 210 may be constructed from relatively inexpensive materials. For instance, the independent nature of the outer panels 202, 204, 206, 208, and 210 provides flexibility in that these panels may be constructed from any suitable materials for absorbing impact and/or resisting heat. By comparison, an internal cabinet 200 may need to be constructed from certain materials (e.g., aluminum) that may be relatively expensive in order to comply with various standards and regulations, e.g., regarding strength, durability, etc. The outer panels 202, 204, 206, 208, and 210; however, may comprise any suitable construction that allows the panels to function as mechanical and/or solar shields. In some aspects, the outer panels 202, 204, 206, 208, and 210 may be constructed from fiber glass, high-impact plastic, polymer, and the like.

Referring briefly to FIG. 2C, the cabinet assembly 200 may comprise at least one bottom panel 216 arranged below the internal cabinet wall 104. For instance, such a bottom panel 216 may include a single wall arranged on one side of the frame 102. Alternatively, one or more bottom panels 216 may be provided that wrap around one or more sides of the frame 102. As previously mentioned, a cabinet may comprise an auxiliary chamber formed below the internal chamber 106. Thus, an internal surface of the bottom panel 216 may act as an outer wall of an auxiliary chamber formed therein. In one aspect, the bottom panel 216 may be implemented as a double-walled panel that surrounds an auxiliary chamber. In another aspect, the bottom panel 216 may be arranged around an independent outer wall of an auxiliary chamber so as to provide a double-walled construction.

Figure 3A:
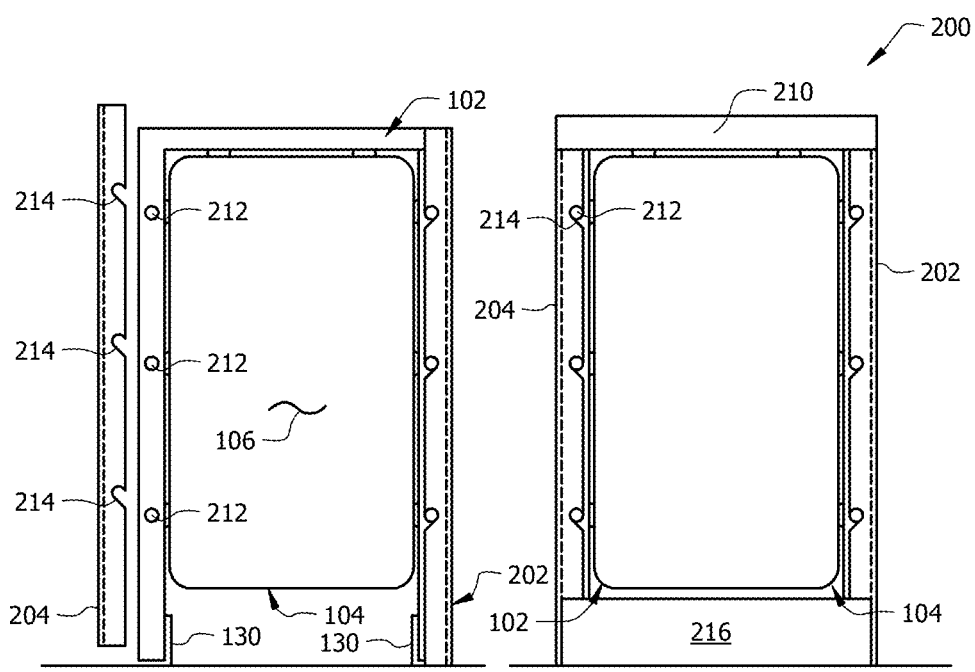
FIGS. 3A and 3B are front and rear perspective views of a cabinet according to an embodiment of the present disclosure.
Figure 3A:
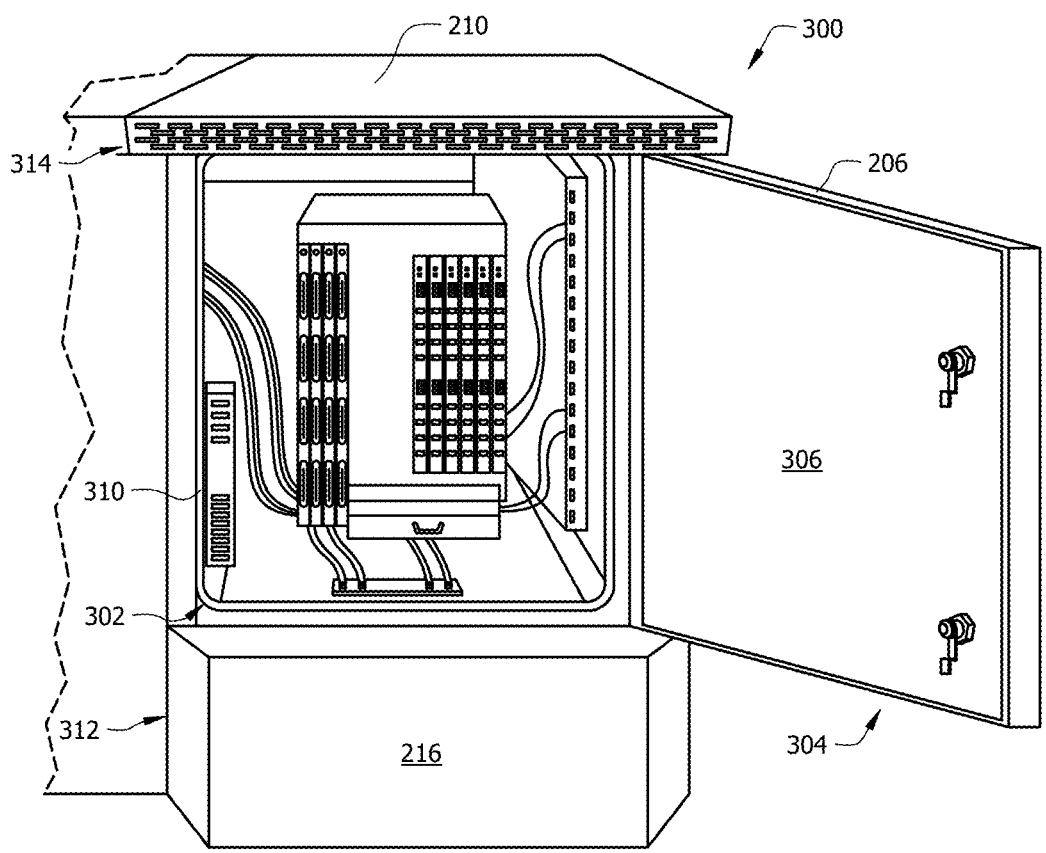
Figure 3B:
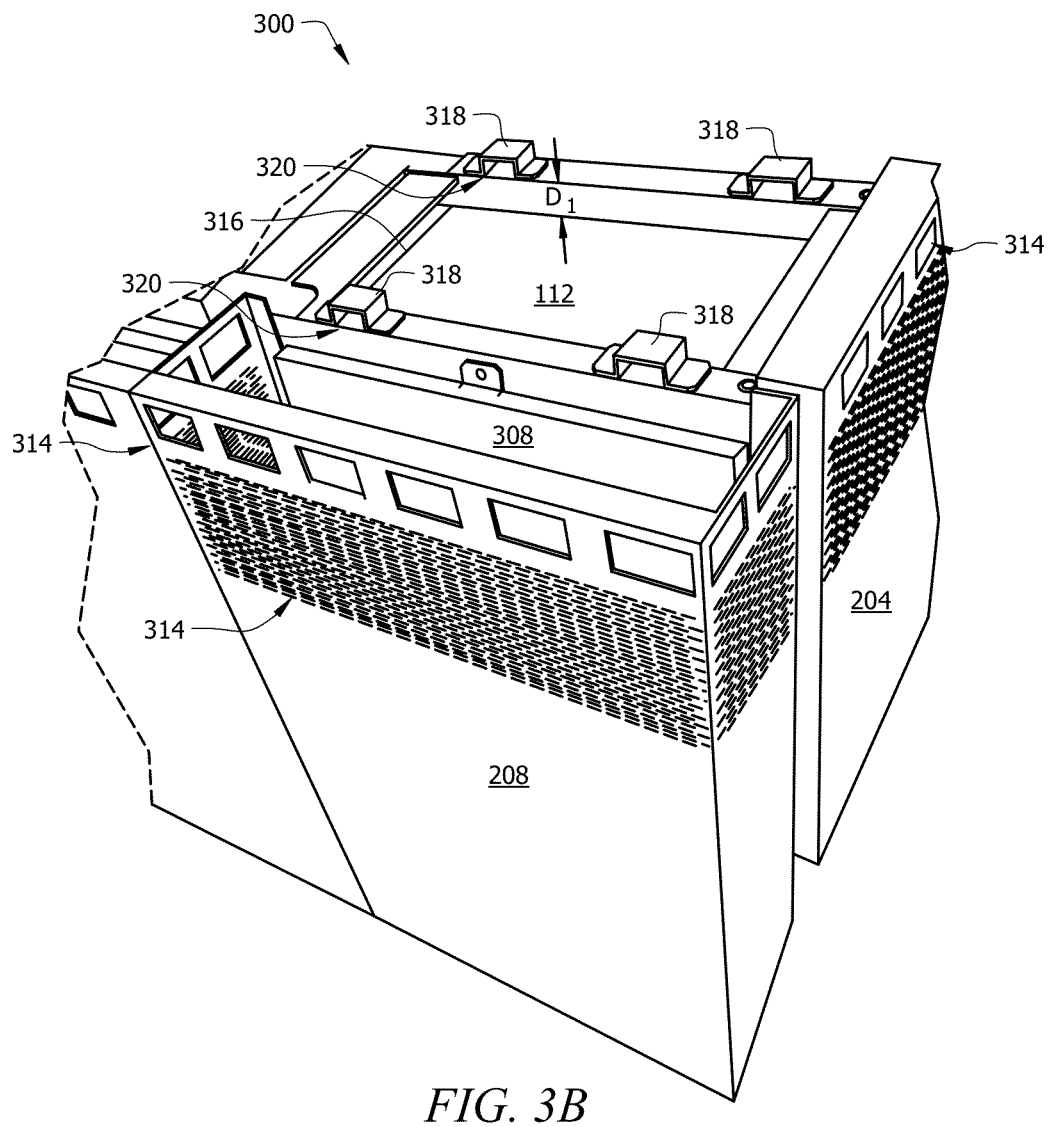

Referring now to FIGS. 3A and 3B, a front and rear view of a cabinet embodying the principles of the present disclosure is illustrated therein and designated generally as cabinet 300. For purposes of discussion, the cabinet 300 will herein be described based on an implementation comprising the framework 100 and assembly 200 discussed above. However, it is to be understood that in other embodiments the cabinet 300 may comprise more or less features without departing from the scope of the present disclosure.

In an embodiment, the cabinet 300 may comprise one or more compartments for enclosing components such as electronic equipment. In one aspect, for example, the peripheral wall 104 of the cabinet 300 may form part of an interior (e.g., internal chamber 106) of a main compartment 302. As discussed below, the cabinet 300 may comprise a pair of parallel panels that cooperate with the sidewalls 108, 110, 112, and 114 to provide a watertight and/or airtight environment within the main compartment 302 when sealed. To this end, the cabinet 300 may comprise one or more gaskets, seals, or any other suitable sealing elements and may be arranged about the main compartment 302 to provide a substantially sealed interior.

As shown in FIG. 3A, the cabinet 300 may comprise a front door 304, which may be may be movable to selectively seal or provide access to the interior of the main compartment 302. In some embodiments, the front door 304 may simply comprise a single panel 306 configured as a single-walled door 304. Alternatively, the front door 304 may comprise a pair of panels configured to provide a double-walled door 304. In FIG. 3A, for example, the front outer panel 206 is shown as being arranged on or about the inner front panel 306 to provide a double-walled door 304.

According to one aspect, the outer and inner front panels 206 and 306 may be spaced apart such that each panel 206 and 306 is thermally isolated from one other. For example, the front panels 206 and 306 may be configured such that there is no or a substantially insignificant amount of thermal transfer between the surfaces thereof. As shown in FIG. 3B, the cabinet 300 may comprise a back cover or panel 308 that defines a back wall of the main compartment 302. Analogous to the front panels 206 and 306, the outer and inner back panels 208 and 308 may be spaced apart and thermally isolated from one other.

Similarly, the outer top panel 210 may be spaced apart and thermally isolated from the top cabinet wall 112. As those versed in the art will understand, such isolation between walls and/or panels may be achieved by way of any suitable mechanism or device, such as, but not limited to, "I"-shaped spacers, "Z"-shaped spacers, spacer-bolt assemblies, spacer columns, or the like. While the inner front and back panels 306 and 308 are shown as generally comprising a flat configuration, in some implementations, the inner front panel 306 and/or the back panel 308 may comprise a substantially corrugated configuration.

As previously mentioned, the side openings 124, 126 and top opening 128 of the frame 102 may form gaps such that the outer side panels 202 and 204 are spaced apart from the sidewalls 108 and 110 of the cabinet 300. In an embodiment; therefore, the outer panels 202, 204, 206, 208, and 210 may be arranged around the inner cabinet walls/panels 108, 110, 306, 308, and 112, respectively, wherein the corresponding outer and inner panels cooperate to provide a cabinet 300 comprising a double-walled construction. In this manner, heating of the cabinet 300 (e.g., via solar heating) may not result in a substantial transfer of heat from the outer panels 202, 204, 206, 208, and 210 to the interior of the main compartment 302, e.g., via inner walls/panels 108, 110, 306, 308, and 112, respectively.

In some embodiments, the top panel 210 may cover the top wall 112 of the main compartment 302 and extend over the door 304 when the door 304 is closed. As such, the entry and possible accumulation of outdoor particles at the top section where the closed door 304 and the cabinet 300 meet may be minimized. Moreover, at least one sealing element 310 such as a gasket may be circumferentially arranged around a front edge of the peripheral wall 104 and/or the frame 102 such that the main compartment 302 is substantially sealed when the door 304 is closed. In FIG. 1A, for example, it can be seen that the peripheral wall 104 may comprise a width that extends slightly beyond the front of the frame 102 to form a front flange or rim. Additionally or alternatively, the width of the peripheral wall 104 may extend slightly beyond the back of the frame 102 (see FIG. 2A) to form a similar flange or rim for receiving a gasket to seal the main compartment 302 when the back panel 308 is attached thereto.

In an embodiment, the main compartment 302 may comprise a bottom wall (e.g., wall 114) that defines a top wall for an adjacent auxiliary compartment 312 formed below. Moreover, the outer bottom panel 216 may define a lower front wall of the auxiliary compartment 312, which may be sealed by any suitable means. Alternatively, the bottom outer panel 216 may be spaced apart and thermally isolated from an inner bottom panel (not shown) of the auxiliary compartment 312. Therefore, analogous to the main compartment 302, one or more sides of the auxiliary compartment 312 may be of a double-walled construction.

In some implementations, the auxiliary compartment 312 may be configured to enclose additional components (e.g., batteries), which may or may not be related to other components stored within the main compartment 302. Additionally or alternatively, at least one wall or panel of the cabinet 300 may include one or more openings fitted with suitable attachments such as one or more cable connectors, strain relief cable connectors, etc. Such attachments may facilitate the passage of cables into and/or out of one or more compartments (e.g., compartments 302 and 312), as well as provide a seal or thermal barrier between two or more compartments. Moreover, because the frame 102 may be disposed on a pair of angles 130, a relatively large open area may be formed for accommodating more cables and/or connectors to be fitted below the auxiliary compartment 312, if desired. Furthermore, since such angles 130 do not require much space, a relative small quantity of material may be used to isolate the cabinet 300 from the earth or concrete ground, if necessary (e.g., to comply with certain isolation requirements that may be imposed).

In an embodiment, the cabinet 300 may comprise a plurality of ports or vents 314 for facilitating airflow circulation. While the vents 314 are shown in FIGS. 3A and 3B as being formed along or about an upper portion of the outer panels (e.g., panels 204, 208, and 210), it is to be understood that a plurality of similar ports or vents may be formed on or about any suitable location of one or more outer panels 202, 204, 206, 208, and 210. In addition, the vents 314 do not necessarily need to be similar, as the vents 314 may comprise any suitable size and/or shape for allowing air to flow towards and/or away from the cabinet 300. To this end, the cabinet 300 may comprise one or more temperature regulating equipment such as, but not limited to, fans, heat exchangers, thermoelectric coolers, air conditioning units, etc.

As best shown in FIG. 3B, for example, the cabinet 300 may comprise a height such that a gap 316 is formed above the top cabinet wall 112 and that may extend upward to define a minimum depth $D_1$. Thus, at least one temperature regulating device such as a fan may be disposed within the gap and generally enclosed by the top outer panel 210, which may sit on top of one or more feet members 318 defining internal channels 320 therethrough. In operation, such a fan may be configured to force air over one or more walls of the main compartment 302 such that air flows either towards or away from the cabinet 300, e.g., via channels 320 or vents 314.

In an embodiment, the peripheral wall 104 and the inner panels 306 and 308 may provide a substantially sealed internal compartment 302. As such, any transfer of heat (e.g., either naturally or by way of a fan or the like) may be carried out indirectly through the walls of the main compartment 302 (e.g., via conduction). Furthermore, although the main compartment 302 may be substantially sealed, the cabinet 300 may comprise filter media, screening, and/or any suitable filtering elements for further minimizing and/or preventing the entry of moisture and debris into the main compartment 302, e.g., due to wind, rain, snow, etc.

In some embodiments, the cabinet 300 may be constructed from one or more suitable metals or materials, such as, but not limited to, steel, stainless steel, aluminum, titanium, plastic, etc. As those of ordinary skill in the art will understand, such materials may be selected based on various factors, such as thermal characteristics, strength, durability, etc. In an embodiment, the cabinet 300 may be primarily supported by the frame 102 described above. Accordingly, the frame 102 may comprise a construction of sufficient size and character to provide all or substantially all of the structural strength necessary for supporting the cabinet 300.

Similarly, the frame 102 may also be configured to support any components stored within the cabinet 300. For instance, rather than mounting components to the inner walls of the cabinet 300, one or more components may be mounted to the frame 102 in a manner similar to that in which the peripheral wall 104 of the cabinet 300 may be mounted to the frame 102. That is, any suitable fasteners (e.g., mounts 122) may be threaded through the peripheral wall 104 (e.g., via grooves 116 and 118) and into slots 120 formed within the frame 102 for attaching one or more components.

By providing a frame 102 as disclosed herein, the cabinet 300 may comprise a wide variety of shapes and/or sizes that may otherwise be unsuitable without the frame 102. As shown in FIG. 2B, for example, the cabinet 300 may comprise a single-walled structure that is substantially corrugated to form an accordion-shaped body 300. Assuming the cabinet 300 lacked the frame 102 in this example, the overall construction of the cabinet 300 may be relatively flimsy or otherwise unstable to practically support itself without additional reinforcements. Moreover, such reinforcements may add relatively more size, weight, and/or cost than might be necessary by employing a frame 102 according to the present disclosure. In other words, the frame 102 acts to reduce or eliminate the need for a providing a cabinet that is capable of supporting itself and/or any components stored therein. As a result, a cabinet 300 supported by the frame 102 may comprise a relatively lightweight, inexpensive, and/or thin-walled structure.

Figure 4A:
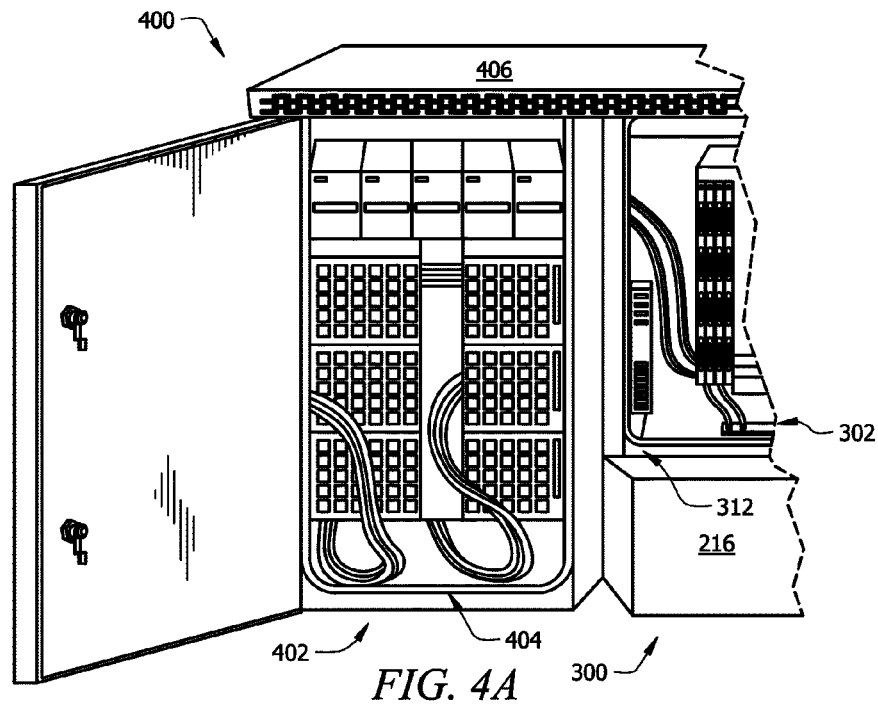
FIGS. 4A and 4B are front perspective views of a modular thermal system according to an embodiment of the present disclosure.
Figure 4B:
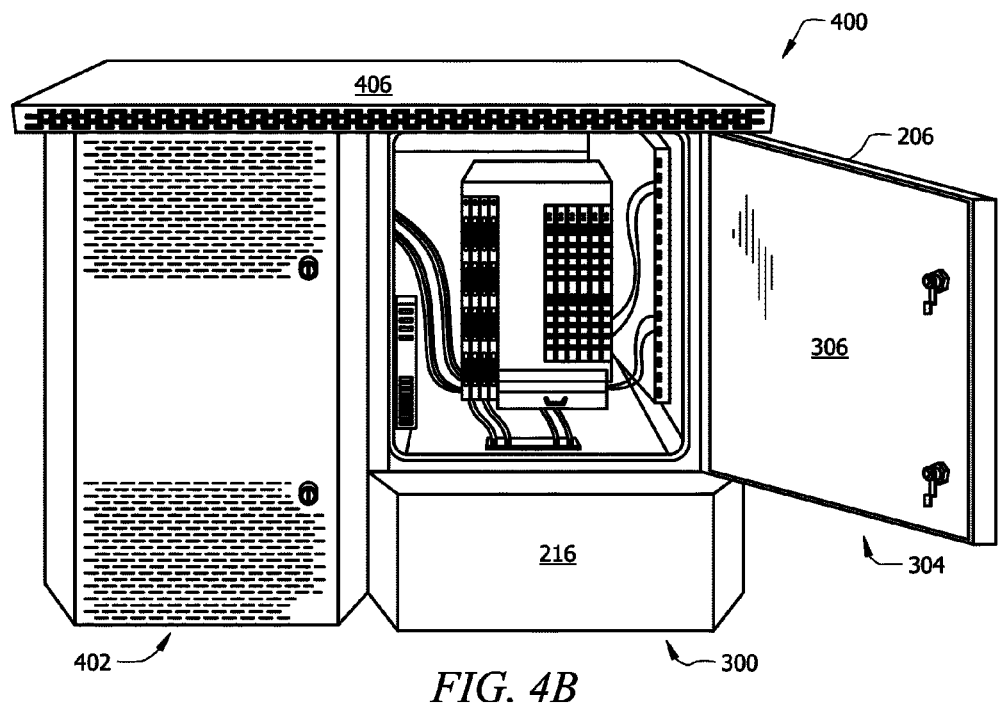

In some embodiments, the cabinet 300 may be implemented as part of a thermal system comprising a plurality of similar or substantially similar cabinets 300. According to one implementation, the cabinet 300 may be paired with one or more cabinets to provide a modular framework system. FIGS. 4A, and 4B, for example, illustrate a modular thermal system 400 in which the cabinet 300 is configured to attach to at least one adjacent cabinet 402. For the sake of clarity, the first cabinet 300 and the second cabinet 402 will herein be referred to as a first (or primary) cabinet 300 and a second (or secondary) cabinet 402, respectively.

In one aspect, the first and second cabinets 300 and 402 may be identical to one another. In another aspect, the first and second cabinets 300 and 402 may be identical except that the cabinets 300 and 402 may be of a different size, shape, or other configuration. For instance, the first cabinet 300 may comprise a corrugated cabinet wall 104 and the second cabinet 402 may comprise a non-corrugated wall (or vice-versa). In yet another aspect, the cabinets 300 and 402 may comprise more or less compartments than one another.

In FIGS. 4A and 4B, for example, the first cabinet 300 is shown as comprising a main compartment 302 and an auxiliary compartment 312 (e.g., a battery base), whereas the second cabinet 402 is shown as comprising a single compartment 404. In some aspects, one or more openings may be provided to connect one or more components within the compartments of each cabinet 300 and 402. For instance, batteries enclosed within the auxiliary compartment 312 may be configured to energize one or more components in the main compartment 404.

For convenience, the second cabinet 402 will herein be described as being substantially the same as the first cabinet 300. Thus, while the second cabinet 402 may be shown as lacking an auxiliary compartment 312, the second cabinet 402 may otherwise be identical to the first cabinet 300. Of course, it should be understood that in other embodiments, the second cabinet 402 may be substantially different from the first cabinet 300. For instance, the second cabinet 402 may be an independent and/or existing cabinet to which the first cabinet 300 may attach to provide a modular thermal system 400. Furthermore, one or more similar or different cabinets may also be attached to the first and/or second cabinets 300 and/or 402. As those of ordinary skill in the art will understand, such cabinets may be attached together by way of any suitable fasteners.

In an embodiment, the first and second cabinets 300 and 402 may share one or more outer panels. For instance, a common outer panel 406 may overlay the top of the two cabinets 300 and 402 such that a unitary structure is provided. Similarly, a common outer panel may surround the back walls of each cabinet 300 and 402. Of course, it should be understood that in other embodiments, the first and second cabinets 300 and 402 may comprise one or more outer panels that are independent with respect to one another.

Figure 5A:
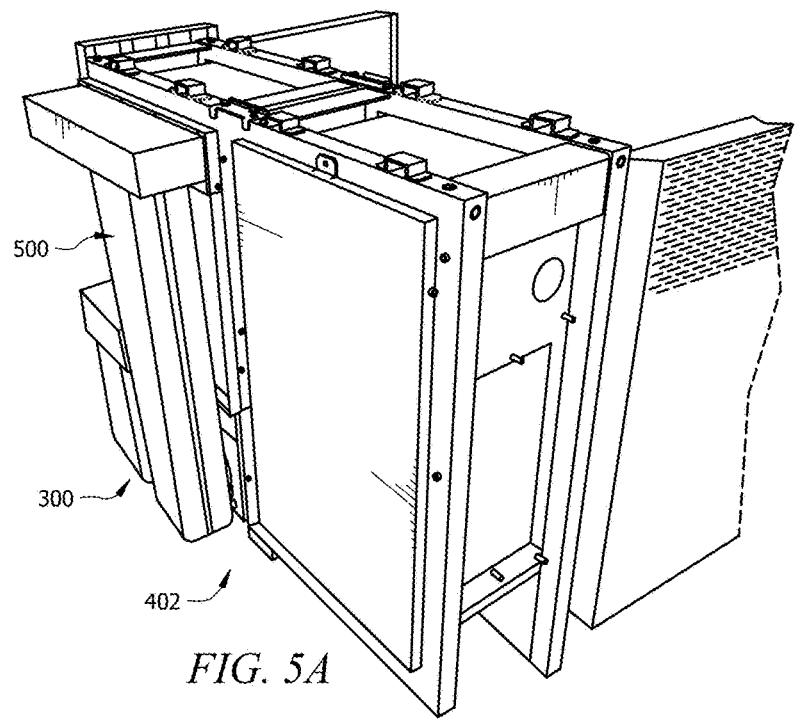
FIGS. 5A-5C are various perspective views of cabinets depicted in FIGS. 4A and 4B.
Figure 5B:
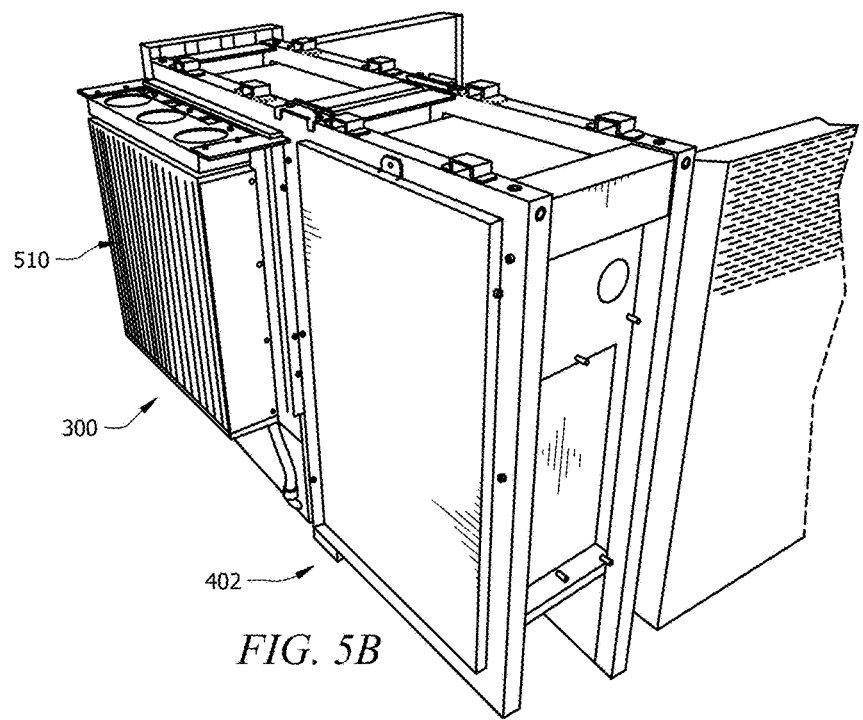
Figure 5C:
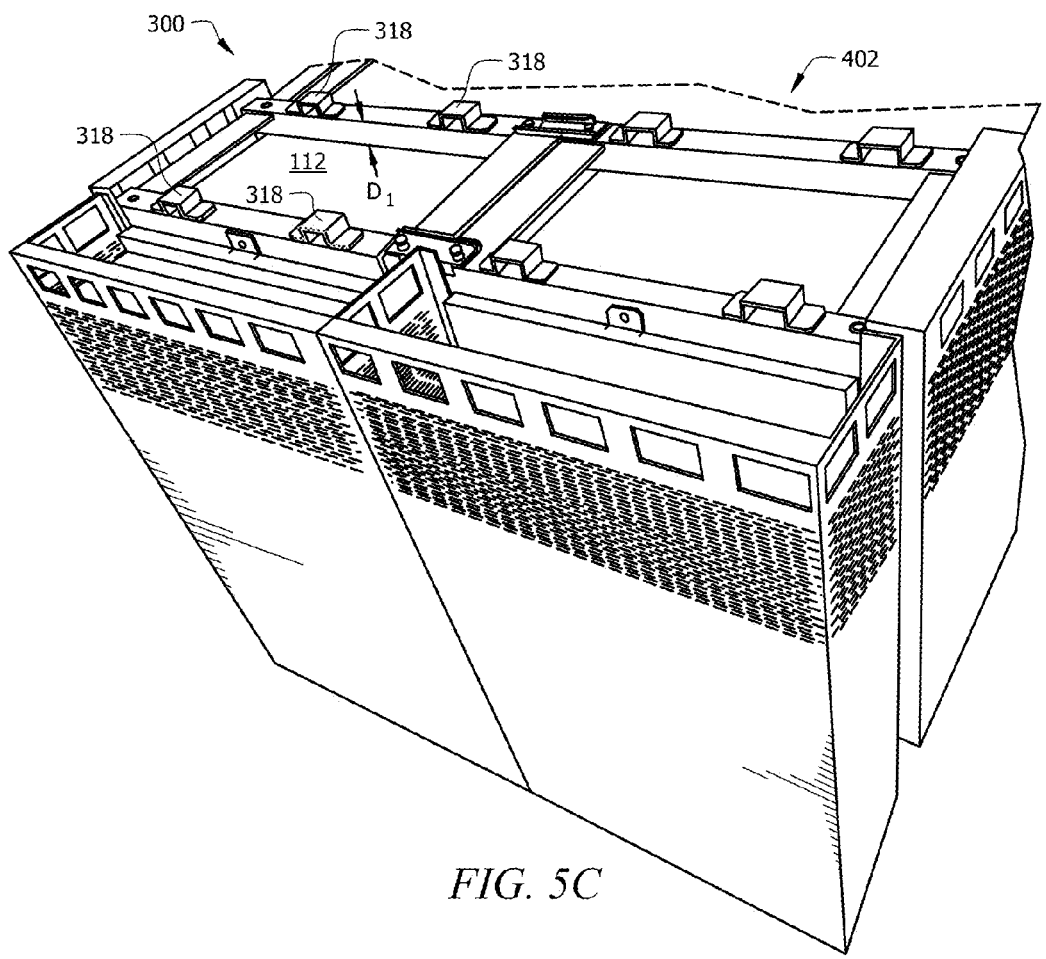

Referring briefly to FIGS. 5A-5C, various embodiments of the cabinets 300 and 402 will now be described. For clarity, the cabinets 300 and 402 are depicted in FIGS. 5A-5C without an outer top panel, yet the cabinets 300 and 402 may share or individually comprise an independent top outer panel. Similarly, the secondary cabinet 402 is shown in FIGS. 5A and 5B as lacking an outer back and side panel simply for clarity. As shown in FIG. 5C, however, the secondary cabinet 402 may comprise outer back and side panels that are substantially similar to the outer back 208 and side panels 202 and 204 of the first cabinet 300, respectively. Furthermore, it is to be understood that the embodiments shown in FIGS. 5A, 5B, and/or 5C are similarly applicable to both cabinets 300 and 402.

In FIG. 5A, an embodiment is shown in which ductwork 500 attaches to the back panel of the primary cabinet 300. In some aspects, such ductwork 500 may be configured for facilitating heat transfer. Moreover, at least one temperature-regulating device such as a fan may be disposed along the top cabinet wall(s) and configured to force air into and/or out of the ductwork 500 in order to cool the interior of the main compartment. In FIG. 5B, an alternative embodiment is shown in which at least one heat exchanger 510 may attach to the back panel in order to facilitate the transfer of heat. In FIG. 5C, it can be seen that in either embodiment, an outer back panel may be arranged around the ductwork 500 and/or heat exchanger 510 to provide a double-walled back portion as discussed above. The ductwork 500, the heat exchanger 510, and or some other temperature regulation device may be mounted to the cabinet such that a seal is formed around a rear section of the cabinet. It should be understood that these embodiments are not limited to the examples depicted in FIGS. 5A, 5B, and 5C. That is, these figures are merely for purposes of illustration, as other embodiments may comprise one or more ducts and/or temperature regulating devices that are arranged about a cabinet (e.g., cabinet 300 and/or 402) in any suitable location. In some embodiments, for example, a temperature-regulating device such as a heat exchanger may be arranged as part of a double-walled door.

In some embodiments, any of the cabinets disclosed herein may be configured for any suitable application. For convenience, the following embodiments will be described with respect to the primary cabinet 300, yet it is to be understood that these embodiments may similarly apply to additional or alternative cabinets. In some aspects, the cabinet 300 may be configured as a housing for a terminal block, a panel, a protector block, a chassis, a digital cross-connect, a switch, a hub, a rack, a frame, a bay, a module, an enclosure, an aisle, or other structure for receiving and holding a plurality of components. Such components may include any suitable components, such as, but not limited to, cross-connect panels, modules, terminal blocks, protector blocks, chassis, backplanes, switches, digital radios repeaters, or any combination thereof.

Additionally or alternatively, the cabinet 300 may be configured to store components such as devices utilized for processing and distributing signals in an infrastructure. For instance, such components may be utilized to distribute telecommunications signals sent to and from an infrastructure by one or more end-users using client devices (e.g., computers, personal digital assistant (PDA) devices, mobile phones, etc). As skilled artisans will readily appreciate, the components within the cabinet 300 may terminate, interconnect, and/or cross-connect a plurality of network elements within an infrastructure. Such interconnections between telecommunications equipment (e.g., cabinets, components, network elements, etc.) may be configured to provide signal pathways for telecommunications signals.

As previously mentioned, the cabinet 300 may comprise one or more compartments. In some embodiments, for example, the cabinet 300 may comprise an entrance compartment, which may include one or more walls having openings through which power cables, telecommunications cables, and the like may be routed into the cabinet 300 (e.g., via conduits or a trench). Of course, other cabinet walls or panels may include similar opening for routing cables and/or interconnecting other compartments within the cabinet 300. Additionally or alternatively, the cabinet 300 may comprise a temperature compartment defining an outer chamber surrounding or adjacent to one or more compartments. For instance, a temperature compartment may be configured to circulate air around the walls or panels of the main compartment 302 to facilitate cooling and/or heating of components therein.

Further still, the cabinet 300 may comprise one or more vent compartments. The vent compartment generally includes at least one wall having one or more ports (e.g., vents 314) through which air may flow into and/or out of the vent compartment. In some embodiments, one or more walls within the cabinet 300 may include similar openings to facilitate the flow of air through the cabinet 300. In other embodiments, however, the cabinet 300 may not include any such openings and/or a vent compartment. Instead, for example, the cabinet 300 may include one or more external heat-exchanging devices operable to force air directly and/or indirectly towards and/or away from the cabinet 300.

In some embodiments, the transfer of heat from and/or towards the cabinet 300 may be facilitated by at least one heat exchanger including, but not limited to, at least one reverse- and/or cross-flow plate heat exchanger(s), pipe-type heat exchanger(s), etc. Such heat exchangers may comprise one or more heat-exchanging elements defining a heat exchanger core. In addition, a heat-exchanging element may include one or more extended or convoluted surfaces (e.g., fins), heat pipes, thermoelectric devices, thermally conductive plates, and/or any other suitable elements for transferring heat from one medium to another, e.g., via conduction, convection, thermal radiation, etc. Of course, numerous other elements and/or features associated with the cabinet 300 may be similarly employed, and therefore, necessarily fall within the purview of the present disclosure.

At least one embodiment is disclosed and variations, combinations, and/or modifications of the embodiment(s) and/or features of the embodiment(s) made by a person having ordinary skill in the art are within the scope of the disclosure. Alternative embodiments that result from combining, integrating, and/or omitting features of the embodiment(s) are also within the scope of the disclosure. Where numerical ranges or limitations are expressly stated, such express ranges or limitations should be understood to include iterative ranges or limitations of like magnitude falling within the expressly stated ranges or limitations (e.g., from about 1 to about 10 includes, 2, 3, 4, etc.; greater than 0.10 includes 0.11, 0.12, 0.13, etc.). For example, whenever a numerical range with a lower limit, $R_l$, and an upper limit, $R_u$, is disclosed, any number falling within the range is specifically disclosed. In particular, the following numbers within the range are specifically disclosed: $R=R_l+k*(R_u-R_l)$, wherein k is a variable ranging from 1 percent to 100 percent with a 1 percent increment, i.e., k is 1 percent, 2 percent, 3 percent, 4 percent, 5 percent, . . . , 50 percent, 51 percent, 52 percent, . . . , 95 percent, 96 percent, 97 percent, 98 percent, 99 percent, or 100 percent. Moreover, any numerical range defined by two R numbers as defined in the above is also specifically disclosed. Use of the term "optionally" with respect to any element of a claim means that the element is required, or alternatively, the element is not required, both alternatives being within the scope of the claim. Use of broader terms such as comprises, includes, and having should be understood to provide support for narrower terms such as consisting of, consisting essentially of, and comprised substantially of. Accordingly, the scope of protection is not limited by the description set out above but is defined by the claims that follow, that scope including all equivalents of the subject matter of the claims. Each and every claim is incorporated as further disclosure into the specification and the claims are embodiment(s) of the present disclosure. The discussion of a reference in the disclosure is not an admission that it is prior art, especially any reference that has a publication date after the priority date of this application. The disclosure of all patents, patent applications, and publications cited in the disclosure are hereby incorporated by reference, to the extent that they provide exemplary, procedural, or other details supplementary to the disclosure.

While several embodiments have been provided in the present disclosure, it should be understood that the disclosed systems and methods might be embodied in many other specific forms without departing from the spirit or scope of the present disclosure. The present examples are to be considered as illustrative and not restrictive, and the intention is not to be limited to the details given herein. For example, the various elements or components may be combined or integrated in another system or certain features may be omitted, or not implemented.

In addition, techniques, systems, subsystems, and methods described and illustrated in the various embodiments as discrete or separate may be combined or integrated with other systems, modules, techniques, or methods without departing from the scope of the present disclosure. Other items shown or discussed as coupled or directly coupled or communicating with each other may be indirectly coupled or communicating through some interface, device, or intermediate component whether electrically, mechanically, or otherwise. Other examples of changes, substitutions, and alterations are ascertainable by one skilled in the art and could be made without departing from the spirit and scope disclosed herein.

What is claimed is:

1. A modular structure for storing and cooling electronics, comprising:
   a frame support;
   an internal equipment chamber mounted to the frame support, wherein the internal equipment chamber comprises a tubelike structure defining openings in a front and a back of the internal equipment chamber, and wherein the internal equipment chamber is configured to support electronic equipment such that the weight of the electronic equipment is born by the frame support and not the internal equipment chamber; and a plurality of removable panels disposed around the frame such that a gap is formed between the exterior of the internal equipment chamber and the plurality of removable panels, wherein air may circulate in the gap between the internal equipment chamber and the plurality of removable panels to help regulate a temperature within the internal equipment chamber.

2. The structure of claim 1, further comprising:
a double-walled door mounted to the frame support and forming a seal with the front of the internal equipment chamber when the door is closed.

3. The structure of claim 1, further comprising:
a temperature regulating device mounted to a rear section of the internal equipment chamber and forming a seal therewith, wherein the temperature regulation device is configured to regulate the temperature within the internal equipment chamber.

4. The structure of claim 3, wherein the temperature regulating device comprises one of a fan, an air conditioning unit, a thermoelectric cooler, and a geothermal cooler.

5. The structure of claim 1, wherein the internal equipment chamber comprises a corrugated material.

6. The structure of claim 1, wherein the frame is configured to provide substantially all of the structural strength necessary to support the internal equipment chamber, electronic equipment within the internal equipment chamber, and the plurality of removable panels.

7. The structure of claim 1, wherein the internal equipment chamber comprises a single piece of material formed into the tubelike structure.

8. The structure of claim 1, wherein the plurality of removable panels are configured such that the removable panels may sustain some mechanical damage without damaging the internal equipment chamber.

9. A system for cooling and protecting electronic equipment, comprising:
a structural support frame;
at least two tubelike internal equipment chambers mounted to the structural support frame, wherein each of the tubelike internal equipment chambers comprises a front, a rear opening, and a plurality of equipment mounting areas, and wherein each of the equipment mounting areas are configured such that electronic equipment support devices may be affixed to the structural support frame such that the weight of the electronic equipment is born by the structural support frame and not the tubelike internal equipment chambers;
a plurality of external panels mounted to the structural support frame such that at least one gap is formed between the plurality of external panels and the tubelike internal equipment chambers thereby allowing air to flow in the gap, wherein the plurality of external panels are configured to protect the tubelike internal equipment chambers from damage;
two double paneled back panels mounted to the structural support and configured such that each of the two double paneled back panels forms a back seal with a respective one of the tubelike internal equipment chambers; and
at least one double paneled door mounted to the structural support and configured to form a seal with the front opening of at least one of the tubelike internal equipment chambers when the door is closed.

10. The system of claim 9, wherein the tubelike internal equipment chamber comprises a corrugated material.

11. The system of claim 9, further comprising an interchangeable temperature regulating device mounted to the rear section of at least one of the tubelike internal equipment chambers and forming a seal with the rear section of at least one of the tubelike internal equipment chambers.

12. The system of claim 11, wherein the temperature regulating device comprises one of a fan, an air conditioning unit, a thermoelectric cooler, and a geothermal cooler.

13. A thermal system for cooling electronic equipment, comprising:
a frame including at least a first side having a first opening, a second side having a second opening, and a top side having a third opening, the third opening being substantially perpendicular to the first and second openings;
a cabinet disposed within the frame, the cabinet including a first wall attached to the first side of the frame, a second wall attached to the second side of the frame, a third wall attached to the top side of the frame, and a fourth wall that is substantially parallel to the third wall, wherein the first, second, third, and fourth walls define an internal chamber of the cabinet;
an inner back panel attached to a back side of the frame, the inner back panel defining a back wall of the cabinet;
an inner front panel attached to a front side of the frame, the inner front panel defining a movable front door for selectively permitting access into the internal chamber, wherein the internal chamber is substantially sealed when the front door is in a closed position; and
a plurality of removable panels disposed around the frame, the plurality of removable panels including at least:
a first outer side panel attached to the first side of the frame and disposed opposite the first wall of the cabinet, wherein the first opening of the frame defines a first gap formed between the first outer side panel and the first wall of the cabinet; and
a second outer side panel attached to the second side of the frame and disposed opposite the second wall of the cabinet, wherein the second opening defines a second gap formed between the second outer side panel and the second wall of the cabinet.

14. The thermal system of claim 13, wherein the plurality of removable panels further include at least one of:
an outer top panel attached to the top side of the frame and disposed opposite the third wall of the cabinet, wherein the third opening of the frame defines a third gap formed between the outer top panel and the third wall of the cabinet;
an outer back panel attached to the back side of the frame and disposed adjacent to the inner back panel, wherein the outer back panel is spatially offset from the inner back panel such that a fourth gap is formed therebetween; and
an outer front panel attached to the front side of the frame and disposed adjacent to the inner front panel, wherein the outer front panel is spatially offset from the inner front panel such that a fifth gap is formed therebetween.

15. The thermal system of claim 14, wherein each of the plurality of removable panels comprise solar shields configured to resist heat absorption.

16. The thermal system of claim 13, wherein at least one of the first, second, third, and fourth walls of the cabinet comprise a substantially corrugated configuration.

17. The thermal system of claim 13, wherein each wall of the cabinet comprises a substantially corrugated configuration, and wherein at least the first, second, and third walls of the cabinet include a substantially non-corrugated surface for attaching the cabinet and at least one component to the frame.

18. The thermal system of claim 14, further comprising at least one temperature regulating device disposed within at least one of the first, second, third, fourth, and fifth gaps and configured to facilitate the removal of heat from the internal chamber.

19. The thermal system of claim 13, wherein the frame is configured to provide substantially all of the structural strength necessary to support the cabinet.

20. The thermal system of claim 13, wherein the cabinet walls are formed from a single sheet of metal bent at substantially four equal angles.

\* \* \* \* \*